United States Patent [19]

Nakamura et al.

[11] Patent Number: 5,739,084
[45] Date of Patent: Apr. 14, 1998

[54] METHOD FOR MANUFACTURING A SUPERCONDUCTING DEVICE HAVING A REDUCED THICKNESS OF OXIDE SUPERCONDUCTING LAYER

[75] Inventors: Takao Nakamura; Hiroshi Inada; Michitomo Iiyama, all of Osaka, Japan

[73] Assignee: Sumitomo Electric Industries Ltd., Osaka, Japan

[21] Appl. No.: 778,370

[22] Filed: Jan. 2, 1997

Related U.S. Application Data

[62] Division of Ser. No. 515,701, Aug. 16, 1995, Pat. No. 5,621,223, which is a continuation of Ser. No. 150,790, Nov. 12, 1993, abandoned, which is a continuation of Ser. No. 756,220, Sep. 9, 1991, abandoned.

[30] Foreign Application Priority Data

Sep. 10, 1990 [JP] Japan ............... 2-239423
Sep. 27, 1990 [JP] Japan ............... 2-257853

[51] Int. Cl.⁶ ............................................. H01L 39/24
[52] U.S. Cl. ................... 505/330; 505/329; 505/410; 505/473; 505/702; 505/728; 427/62; 427/63
[58] Field of Search .................. 505/330, 329, 505/410, 473, 702, 235, 193, 728; 427/62, 63

[56] References Cited

U.S. PATENT DOCUMENTS

| | | |
|---|---|---|
| 5,051,396 | 9/1991 | Yamazaki . |
| 5,194,419 | 3/1993 | Shiga et al. . |
| 5,219,834 | 6/1993 | Usuki et al. . |
| 5,229,360 | 7/1993 | Shiga et al. . |
| 5,547,923 | 8/1996 | Nakamura et al. ............ 505/330 |

FOREIGN PATENT DOCUMENTS

| | | |
|---|---|---|
| 280308 | 8/1988 | European Pat. Off. . |
| 324044 | 7/1989 | European Pat. Off. . |
| 106964 | 3/1989 | Japan . |

OTHER PUBLICATIONS

Wu et al, "High Critical Currents in Epitaxial YBaCuO Thin Films on Silicon With Buffer Layers", Appl. Phys. Lett., vol. 54, No. 8, 20 Feb. 1989, pp. 754–756.
Chien et al, "Effect of Noble Metal Buffer Layers on Superconducting YBaCuO Thin Films," Appl. Phys. Let., vol. 51, No. 25, Dec. 21, 1987, pp. 2155–2157.
Ma et al, Appl. Phys. Lett. 55(9) Aug. 1989, pp. 896–898.

*Primary Examiner*—Roy V. King
*Attorney, Agent, or Firm*—Beveridge, DeGrandi, Weilacher & Young, L.L.P.

[57] ABSTRACT

A method for fabricating a superconducting device with a substrate, a first oxide superconductor thin film, a barrier layer, a diffusion layer, and a second oxide superconductor thin film. The first oxide superconductor thin film with a very thin thickness is formed on the principal surface of the substrate. The barrier layer and the diffusion source layer are formed on a portion of the first oxide superconductor thin film. The second oxide superconductor thin film is grown on an exposed surface of the first oxide superconductor thin film until the barrier and diffusion source layers are embedded in the second oxide superconductor thin film, so that a material of the diffusion source layer is diffused into the second oxide superconductor thin film.

3 Claims, 6 Drawing Sheets

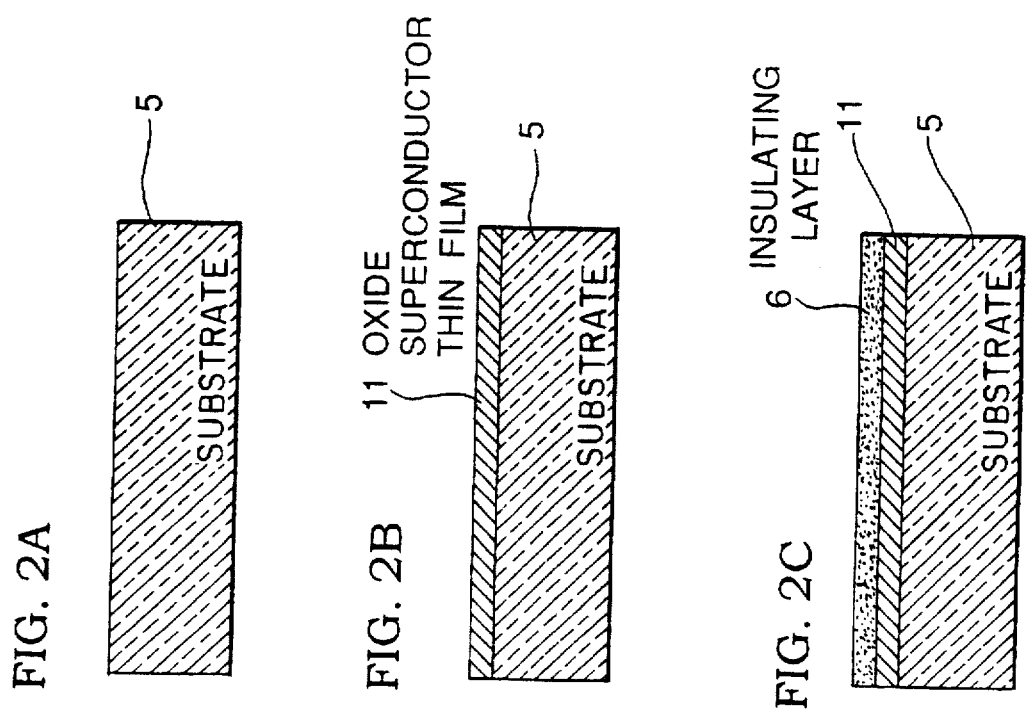

5,739,084

METHOD FOR MANUFACTURING A SUPERCONDUCTING DEVICE HAVING A REDUCED THICKNESS OF OXIDE SUPERCONDUCTING LAYER

This is a divisional of application Ser. No. 08/515,701 filed on Aug. 16, 1995, now U.S. Pat. No. 5,621,223, which was a continuation of Ser. No. 08/150,790 filed on Nov. 12, 1993 (abandoned), which was a continuation of Ser. No. 07/756,220 filed on Sep. 9, 1991 (abandoned).

BACKGROUND OF THE INVENTION

1. Field of the Invention

The present invention relates to a superconducting device and a method for manufacturing the same, and more specifically to a superconducting device including an oxide superconducting layer having a planar upper surface and a partially reduced thickness, and a method for manufacturing the same.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed and with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulator layer on the recessed or undercut rear surface of the portion of the semiconductor layer between the superconductor source electrode and the superconductor drain electrode.

A superconducting current flowing through the semiconductor layer portion between the superconductor source electrode and the superconductor drain electrode due to a superconducting proximity effect is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is a few times the coherence length of the superconductor materials of the superconductor source electrode and the superconductor drain electrode. In particular, since an oxide superconductor has a short coherence length, if the superconductor source electrode and the superconductor drain electrode are formed of the oxide superconductor material, a distance between the superconductor source electrode and the superconductor drain electrode has to be on the order of a few ten nanometers. It is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this connection, however, a thickness of the superconducting channel has to be made on the order of five nanometers.

On the other hand, typical two-terminal devices which utilize a superconductor include a so called Josephson device, which comprises a pair of superconductors coupled to each other through a tunnel barrier. The Josephson device can realize a high speed switching.

The Josephson device formed of an oxide superconductor material thin film can be realized in the Form of a planer type, which is divided into a Dayem bridge (DMB) type and a variable thickness bridge (VTB) type.

The Dayem bridge type Josephson device has been formed of a constant thickness oxide superconductor thin film which is formed on a substrate and which is patterned in a plan view, so hat a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type Josephson device has been formed of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, the characteristics of the planar type Josephson devices have a close relation to the width of the superconductor thin film region having the greatly narrow width in the Dayem bridge type Josephson device, and to the thickness of the thinned oxide superconductor thin film portion in the variable thickness bridge type Josephson device, both of which form the weak link of the Josephson junction. Therefore, in order to obtain desired characteristics with a good repeatability, a high precision on a sub-micron level of the processing such as the etching is required.

The Dayem bridge type Josephson device can be said to be more preferable than the variable thickness bridge type Josephson device, since the Dayem bridge type Josephson device has a relatively planer surface, which is preferred in an integrated circuit. However, in order to form the weak link in the Dayem bridge type Josephson device, it is required to pattern an oxide superconductor thin film having the thickness on the order of 0.5 µm to 1.0 µm into a width of not greater than 0.2 µm. However, it is very difficult to conduct this fine patterning with good repeatability.

On the other hand, in the variable thickness bridge type Josephson device, the very fine pattering is not required in order to form the weak link. However, it is very difficult to uniformly control the remaining thickness of the thinned portion forming the weak link. In addition, the variable thickness bridge type Josephson device cannot have a satisfactorily planer surface. This is not preferable to the integrated circuit application.

SUMMARY OF THE INVENTION

Accordingly, it is an object of the present invention to provide a superconducting device and a method for manufacturing the same, which have overcome the above mentioned defects of the conventional ones.

Another object of the present invention is to provide an FET type superconducting device including an channel composed of an oxide superconducting layer having a planar upper surface and a partially reduced thickness, and a method for manufacturing the same with a good repeatability by using existing established processing techniques.

Still another object of the present invention is to provide a Josephson junction superconducting device including a weak link composed of an oxide superconducting layer having a planar upper surface and a partially reduced thickness, and a method for manufacturing the same with a good repeatability by using existing established processing techniques.

The above and other objects of the present invention are achieved in accordance with the present invention by a superconducting device which comprises a substrate having a principal surface, first and second oxide superconducting regions of a relatively thick thickness formed directly on the principal surface of the substrate and separated from each other, and a third oxide superconducting region of an extremely thin thickness formed directly on the principal surface of the substrate between the first and second oxide superconducting regions so as to bridge the first and second oxide superconducting regions, a barrier layer of a non-superconductor material formed directly on the third oxide superconducting region, a diffusion source layer of a non-superconductor material formed on the barrier layer, and an isolation region formed to cover an upper portion or both side surfaces of the diffusion source layer, the first, second and third oxide superconducting regions and the isolation region being formed of the same oxide superconductor material, the isolation region being diffused with the same material as at least one material contained in the diffusion source layer, so that when the first and second oxide superconducting regions are brought into a superconducting condition, the isolation region does not show superconductivity, and therefore, a superconducting current can flow between the first and second oxide superconducting regions through only the third oxide superconducting region.

In a preferred embodiment, the oxide superconductor material is selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material. In addition, the first, second and third oxide superconducting regions are formed of a single c-axis orientated single crystal film.

The superconducting device in accordance with the present invention, the substrate, on which the oxide superconductor thin film is deposited, can be formed of an insulating substrate, preferably an oxide single crystalline substrate such as MgO, $SrTiO_3$, $CdNdAlO_4$, etc. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAlO_4$ layer and a $BaTiO_3$ layer if a silicon substrate is used.

Preferably, the diffusion source layer is formed of a material selected from the group consisting of silicon and silicide, and the isolation region is diffused with at least silicon. Furthermore, the barrier layer is formed of a material stable to the oxide superconductor material of the first, second and third oxide superconducting regions.

In one embodiment, the isolation region is formed to cover at least the upper portion of the diffusion source layer. Preferably, the first and second oxide superconducting regions and the isolation region are formed of a single oxide superconductor thin film having a substantially planar surface. In this case, the third oxide superconducting region can form a weak link of a Josephson junction, and therefore, the superconducting device constitutes a Josephson device.

In another embodiment, the isolation region is formed to cover at least both side surfaces of the diffusion source layer. In addition, the diffusion source layer can be formed of a conducting material and exposed so as to function as a gate electrode, and the isolation region can be formed of an insulating material. Preferably, the first and second oxide superconducting regions are formed of a single oxide superconductor thin film, and the first and second oxide superconducting regions and the diffusion source layer forming the gate electrode are formed to have a substantially planar surface. In this case, the superconducting device constitutes a super-FET, and the superconducting current flowing between the first and second electrodes through the third oxide superconducting region is controlled by a voltage applied to the gate electrode.

As mentioned hereinbefore, in the conventional super-FET, a superconducting current flows through the semiconducting channel due to the superconducting proximity effect. However, in the super-FET in accordance with the present invention, a main current flows through the superconductor. Therefore, the limitation in the fine processing techniques required for manufacturing the super-FET can be relaxed.

The above mentioned superconducting device in accordance with the present invention can be formed by preparing a substrate having a planar principal surface thereof, forming a first oxide superconductor thin film having a very thin thickness on the principal surface of the substrate, forming on a portion of the first oxide superconductor thin film a stacked structure including a barrier layer formed directly on the first oxide superconductor thin film and a diffusion source layer formed on the barrier layer, and growing a second oxide superconductor thin film on an exposed surface of the first oxide superconductor thin film until the stacked structure is embedded in the second oxide superconductor thin film, so that at least one material contained in the diffusion source layer is diffused into region of a second oxide superconductor thin film surrounding the diffusion source layer, and the diffused region does not show superconductivity when a non-diffused region of the second oxide superconductor thin film shows superconductivity.

As mentioned hereinbefore, in the conventional superconducting device, after the superconductor thin film having a uniform thickness and flat upper and lower surfaces was formed, the superconductor thin film is partially abraded or recessed in a thickness direction so as to form a thinned superconductor thin film portion which constitutes a superconducting channel in the super-FET and a weak link in the Josephson device. However, since the required thickness of the thinned superconductor thin film portion is very small, an extremely high degree of precision in a fine processing (for example, etching) has been required in order to obtain desired characteristics of the superconducting device.

On the other hand, in the above mentioned method in accordance with the present invention, after a first superconductor thin film of an extremely thin thickness (which can constitute a superconducting channel in the super-FET and a weak link in the Josephson device) is formed to cover a whole of the principal surface of the substrate, a unique layered structure preventing a superconductor thin film growth is located on a portion of the first superconductor thin film, and then, a second superconductor thin film having a sufficient thickness is selectively grown on the first superconductor thin film. As result, the second superconductor thin film is continuously and epitaxially grown on the first superconductor thin film excluding the superconductor thin film growth preventing layered structure. On the other hand, the second superconductor thin film is not properly grown on the superconductor thin film growth preventing layered structure, and an insulative thin film is formed on the superconductor thin film growth preventing layered structure. Thus, portions of the second superconductor thin film at both sides of the superconductor thin film growth preventing layered structure is bridged by the first superconductor thin film of the extremely thin thickness under the superconductor thin film growth preventing layered structure. In the Josephson device, the first superconductor thin film of the extremely thin thickness forms a weak link, and the second superconductor thin film portions at both sides of the superconductor thin film growth preventing layered structure constitute a pair of superconducting electrode regions. On the other hand, in the super-FET, the first superconductor thin film of the extremely thin thickness forms a superconducting channel, and the second superconductor thin film portions at both sides of the superconductor thin film growth preventing layered structure constitute a pair of superconducting source/drain regions, respectively.

The superconductor thin film growth preventing layered structure is constituted of a diffusion source layer which contains a component which diffuses into the second superconductor thin film when the second superconductor thin film is deposited or grown on the first superconductor thin film, so that formation of a special crystal structure in the second superconductor thin film is prevented by the diffused or doped component. However, in order to prevent the diffusion component from being diffused into the first superconductor thin film, a barrier layer stable to the oxide superconductor material is sandwiched between the first superconductor thin film and the diffusion source layer.

As seen from the above, the extremely thin oxide superconductor thin film (which can constitute a superconducting channel in the super-FET and a weak link in the Josephson device) can be easily formed by precisely controlling the deposition process, and therefore, with a high repeatability. Therefore, it is no longer necessary to conduct a high degree of fine processing such as a fine etching.

In addition, since the upper surface of the superconductor thin film has a planarized upper surface, the superconducting device is very convenient in order to be assembled in an integrated circuit.

In the super-FET, in order to ensure that the superconducting channel can be turned on and off by a voltage applied to the gate electrode, a thickness of the superconducting channel has to be on the order of five nanometers in the direction of an electric field created by the voltage applied to the gate electrode. This extremely thin superconducting channel,can be easily realized or formed in accordance with the method Of the present invention, since the superconducting channel is formed of the first oxide superconductor thin film portion which is deposited or grown to cover the whole of the substrate.

For example, the first oxide superconductor thin film can be formed to have the thickness on the order of about 5 nanometers. This extremely thin oxide superconductor thin film can be formed in a conventional process by precisely controlling both of the thin film growth speed and the growth time. For this purpose, a sputtering can be used. However, since the oxide superconductor crystal has a multi-layer structure in which respective constituent elements are stacked in a layered structured, it is possible to stack a desired number of unit cells of oxide superconductor, by using a MBE (molecular beam epitaxy).

The extremely thin oxide superconductor thin film thus formed or deposited is very preferable in thickness to form a superconducting channel, but insufficient in thickness to form a source region and a drain region. Therefore, the superconducting layer in the source region and the drain region must be further thickened. The above mentioned method in accordance with the present invention is very effective in thickening the source region and the drain region while maintaining the thickness of the extremely thin oxide superconductor thin film in the superconducting channel zone. Namely, a gate electrode is formed on the extremely thin oxide superconductor thin film at a position corresponding to the superconducting channel, and the oxide superconductor thin film is deposited or grown again on the extremely thin oxide superconductor thin film, using the gate electrode as a mask. In this connection, it is preferred to perform this second deposition or growth of the oxide superconductor thin film until the gate electrode is completely embedded in the oxide superconductor thin film, and to planarize the oxide superconductor thin film until an upper surface of the gate electrode is exposed at the planarized upper surface of the oxide superconductor thin film.

In the above mentioned process, the gate electrode is completely embedded in the oxide superconductor thin film at once. In the process of the second deposition or growth of the oxide superconductor thin film, the diffusion material such as silicon included in the gate electrode is diffused into a portion of the oxide superconductor thin film surrounding the gate electrode. Therefore, this diffusion material diffused region is formed to surround the gate electrode. The diffusion material diffused region has a lowered critical temperature or does not any longer have superconductivity, because of the diffused impurity. Accordingly, when the super-FET is used at an operating temperature, this diffusion material diffused region functions as an insulator, and therefore, the gate electrode is electrically isolated from the oxide superconductor thin film by the gate insulator and the diffusion material diffused region.

The above and other objects, features and advantages of the present invention will be apparent from the following description of preferred embodiments of the invention with reference to the accompanying drawings.

BRIEF DESCRIPTION OF THE DRAWINGS

FIGS. 2A to 2I are diagrammatic sectional views for illustrating the process for manufacturing the superconducting device shown in FIG. 1;

DESCRIPTION OF THE PREFERRED EMBODIMENTS

Figure 1:
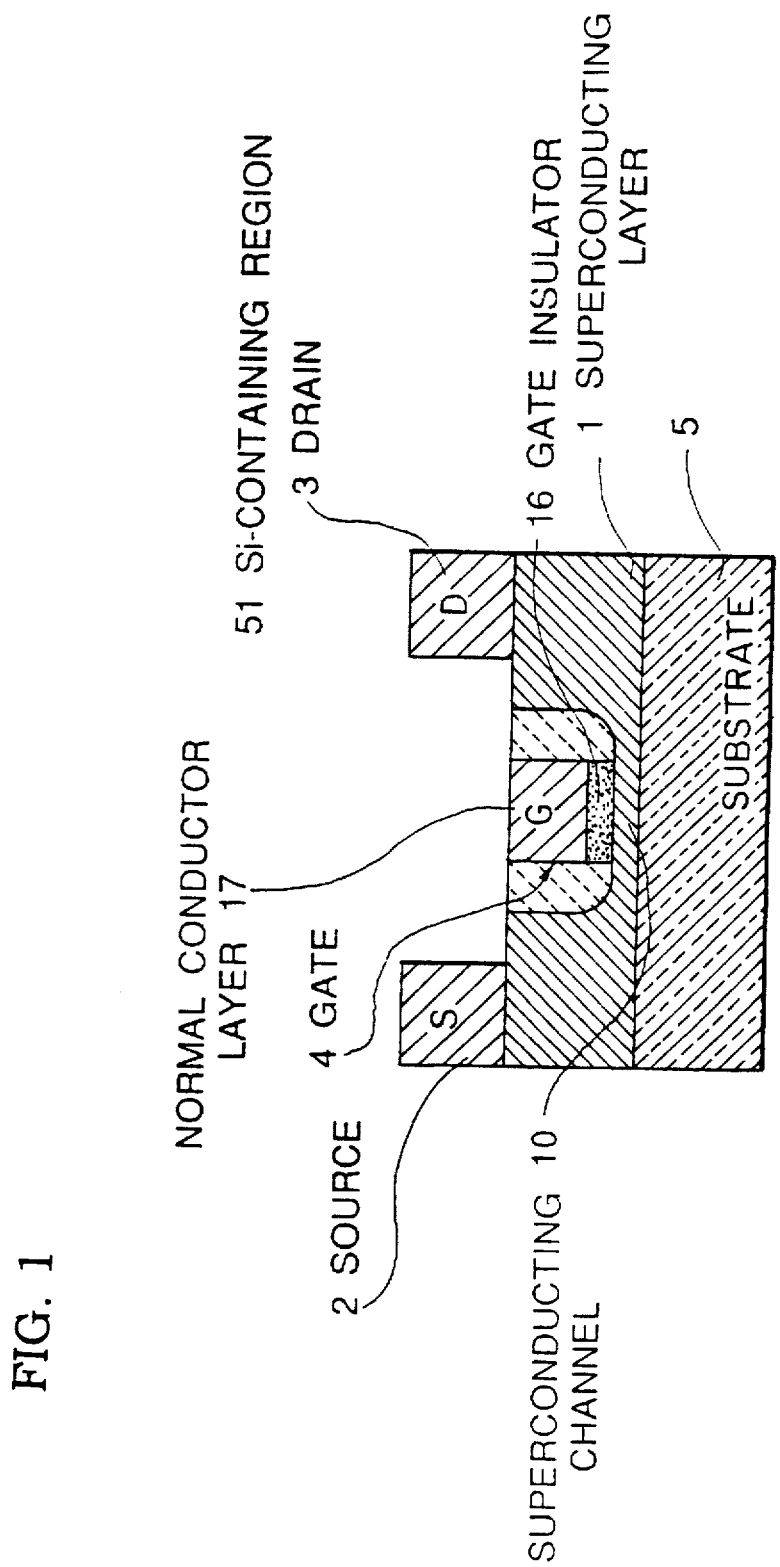
FIG. 1 is a diagrammatic sectional view of one embodiment of the superconducting device in accordance with the present invention.

Referring to FIG. 1, there is shown a diagrammatic sectional view of one embodiment of the superconducting device in accordance with the present invention. The shown superconducting device is a super-FET.

The super-FET includes an oxide superconducting layer 1 formed on a substantially planar principal surface of a substrate 5. The oxide superconducting layer 1 has a gate electrode 4 embedded therein, and a substantially planar principal surface is formed of an upper surface of the oxide superconducting layer 1 itself and an upper exposed surface of the embedded gate electrode 4. A thickness of the oxide superconducting layer 1 is extremely thin underneath the gate electrode 4 so that a superconducting channel 10 having a thickness of about five nanometers is formed under the the gate electrode 4. The gate electrode 4 is formed of a gate insulator 16 formed directly on the superconducting channel 10, and a normal conductor layer 17 formed on the gate insulator 16. The normal conductor layer 17 is formed of for example polysilicon or a compound containing silicon, such as silicide. In addition, a portion of the oxide superconducting layer 1 surrounding the gate electrode 4 is changed into a region 51 containing silicon diffused from the normal conductor layer 17.

Therefore, the silicon containing region 51 is formed of a silicon doped oxide superconductor, which has a critical temperature greatly or remarkably lower than that of the other portion of the oxide superconducting layer 1. Alternately, the silicon containing region 51 no longer has superconductivity, dependently upon the doped amount of silicon. In any case, at an operating temperature of the shown super-FET, the oxide superconducting layer 1 is brought into and maintained in a superconducting condition, but the silicon containing region 51 does not have superconductivity. Accordingly, the gate electrode 4 is isolated from the oxide superconducting layer 1 by the the silicon containing region 51 and the gate insulator 16.

In addition, a source electrode 2 and a drain electrode 3 are formed on the substantially planar principal surface of the oxide superconducting layer 1 at both sides of the gate electrode 4.

Now, the process for manufacturing the above mentioned superconducting device will be described with reference to FIGS. 2A to 2I.

First, a substrate 5 having a substantially planar principal surface is prepared as shown in FIG. 2A. This substrate 5 is formed of for example, an insulating substrate such as a MgO (100) substrate, a SrTiO$_3$ (100) substrate, a CdNdAlO$_4$ (001) substrate or others, or a semiconductor substrate such as a silicon substrate having a principal surface coated with a buffer layer composed of an insulating film. Preferably, the principal surface of the silicon substrate is continuously coated with MgAlO$_4$ by a CVD (chemical vapor deposition) and also with BaTiO$_3$ by a sputtering process.

As shown in FIG. 2B, an extremely thin oxide superconductor thin film 11 on the order of about five nanometers is deposited on the principal surface of the substrate 5, by for example an off-axis sputtering, a reactive evaporation, an MBE (molecular beam epitaxy), a CVD, etc. This extremely thin oxide superconductor thin film 11 forms the superconducting channel when the super-FET is completed. The oxide superconductor material is preferably formed of, for example, a Y—Ba—Cu—O type compound oxide superconductor material, a Bi—Sr—Ca—Cu—O type compound oxide superconductor material, and a Tl—Ba—Ca—Cu—O type compound oxide superconductor material. In addition, a c-axis orientated thin film is preferably deposited, since the c-axis orientated thin film has a large critical current density in the direction in parallel to the substrate surface.

Then, as shown in FIG. 2C, an insulating layer 6 is deposited on the oxide superconductor thin film 11. The insulating layer 6 is deposited to have a thickness not less than ten nanometers. In addition, the insulating layer 6 is formed of an insulating material such as MgO, which does not form a large density of energy levels between the superconductor thin film 1 and the insulating layer 6.

Furthermore, as shown in FIG. 2C, a polysilicon layer 7 is deposited on the insulating layer 6. This polysilicon layer 7 can be deposited by a vacuum evaporation or any other suitable process. The polysilicon layer 7 is 200 nm in thickness. The polysilicon layer 7 can be formed of a metal silicide in place of the polysilicon.

Figure 2F:
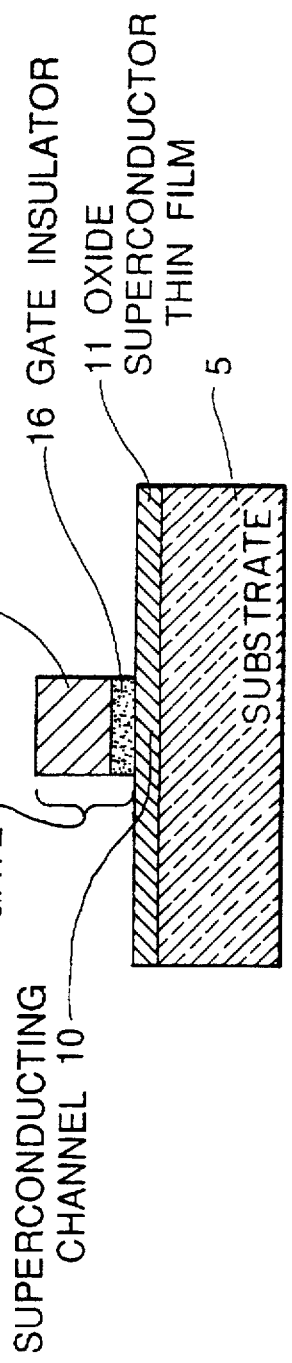

Thereafter, the stacked layer of the insulating layer 6 and the polysilicon layer 7 is selectively removed so as to form the gate electrode 4. For this purpose, as shown in FIG. 2E, the polysilicon layer 7 is selectively etched so as remove all of the polysilicon layer excluding a portion which becomes the gate electrode on the superconducting channel 10, so that the normal conductor layer 17 of the gate electrode 4 is formed. Then, as shown in FIG. 2F, the insulating layer 6 is selectively etched in a self alignment to the normal conductor layer 17 of the gate electrode 4, so that an gate insulator 16 is left on the superconducting channel 10 and only under the the normal conductor layer 17 of the gate electrode 4. In this connection, it is desired that the gate insulator 16 is side-etched in comparison with the normal conductor layer 17 of the gate electrode 4.

After the gate electrode 4 composed of the gate insulator 16 and the normal conductor layer 17 of polysilicon is formed on the superconducting channel 10, as shown in FIG.

2G, the oxide superconductor thin film is grown again on the substrate 5, namely on the extremely thin oxide superconductor thin film 11, so that the gate electrode 4 is completely embedded within the deposited oxide superconductor thin film 1. For example, the oxide superconductor thin film 1 is grown to have a thickness on the order of about 300 nm.

In the process of growth of the oxide superconductor thin film 1, the silicon of the polysilicon layer 17 of the gate electrode 4 is diffused into a portion of the oxide superconductor thin film 1 surrounding the gate electrode 4, so that a silicon containing region 51 is formed around the gate electrode 4. But, the silicon of the polysilicon layer 17 is not diffused into the oxide superconductor thin film 1 underneath the gate insulator 16, since the gate insulator 16 functions as a barrier preventing diffusion of the silicon of the polysilicon layer 17. Therefore, when the super-FET is cooled so that the oxide superconductor thin film 1 is brought into a superconducting condition, the gate electrode 4 is electrically isolated from the oxide superconductor thin film 1 by the silicon containing region 51 and the gate insulator 16.

Figure 2G:
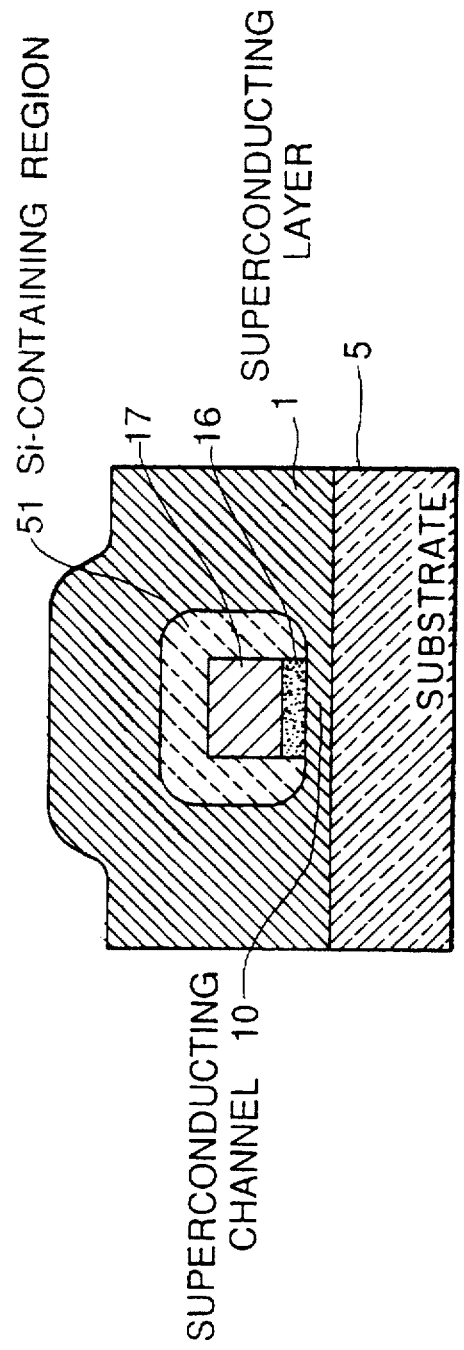
Figure 2H:
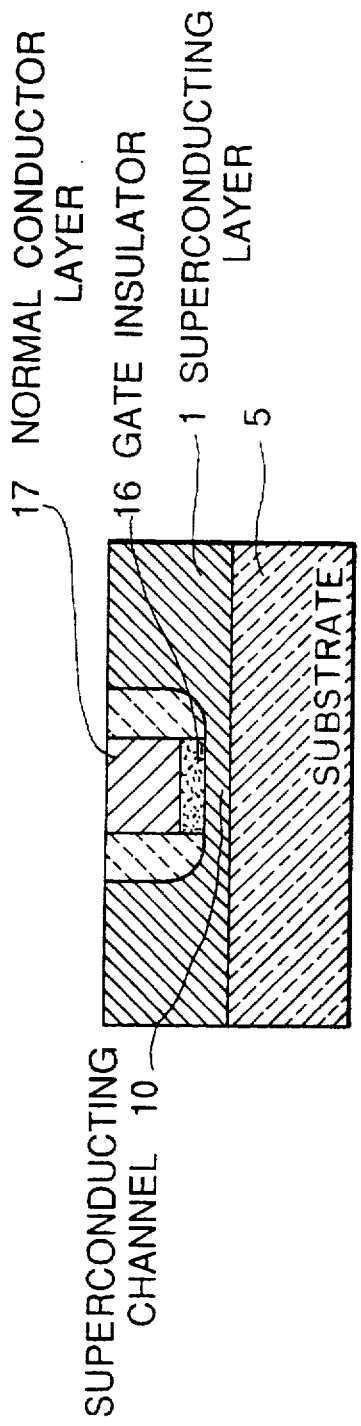

Thereafter, in order to planarize an upper surface of the deposited oxide superconductor thin film 1, a photoresist layer (not shown) is deposited on the oxide superconductor thin film 1 in such a manner that the deposited photoresist layer has a flat upper surface, and then, the deposited photoresist layer and the deposited oxide superconductor thin film 1 are etched back, until the upper surface of the oxide superconductor thin film 1 is planarized and the polysilicon layer 17 of the gate electrode 4 is exposed at the planarized upper surface of the oxide superconductor thin film 1 as shown in FIG. 2H.

Figure 2I:
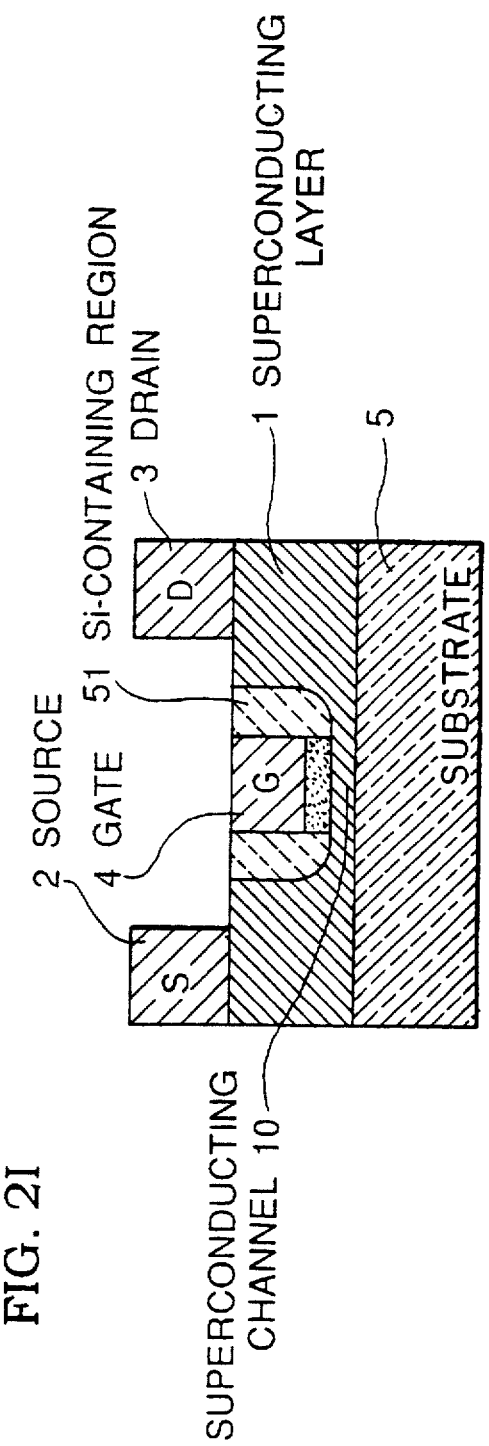

Finally, as shown in FIG. 2I, a source electrode 2 and a drain electrode 3 of Au are formed on the oxide superconductor thin film 1 at both sides of the gate electrode 4, respectively. With this, the super-FET in accordance with the present invention is completed.

As explained above, if the super-FET in accordance with the present invention is manufactured in accordance with the method of the present invention, the limitation in the fine processing technique required for manufacturing the super-FET is relaxed. In addition, since the upper surface of the superconductor thin film is planarized, it become easy to form conductor wirings in a later process. Accordingly, it is easy to manufacture the super-FET with good repeatability, and the manufactured super-FET has a stable performance.

Figure 3:
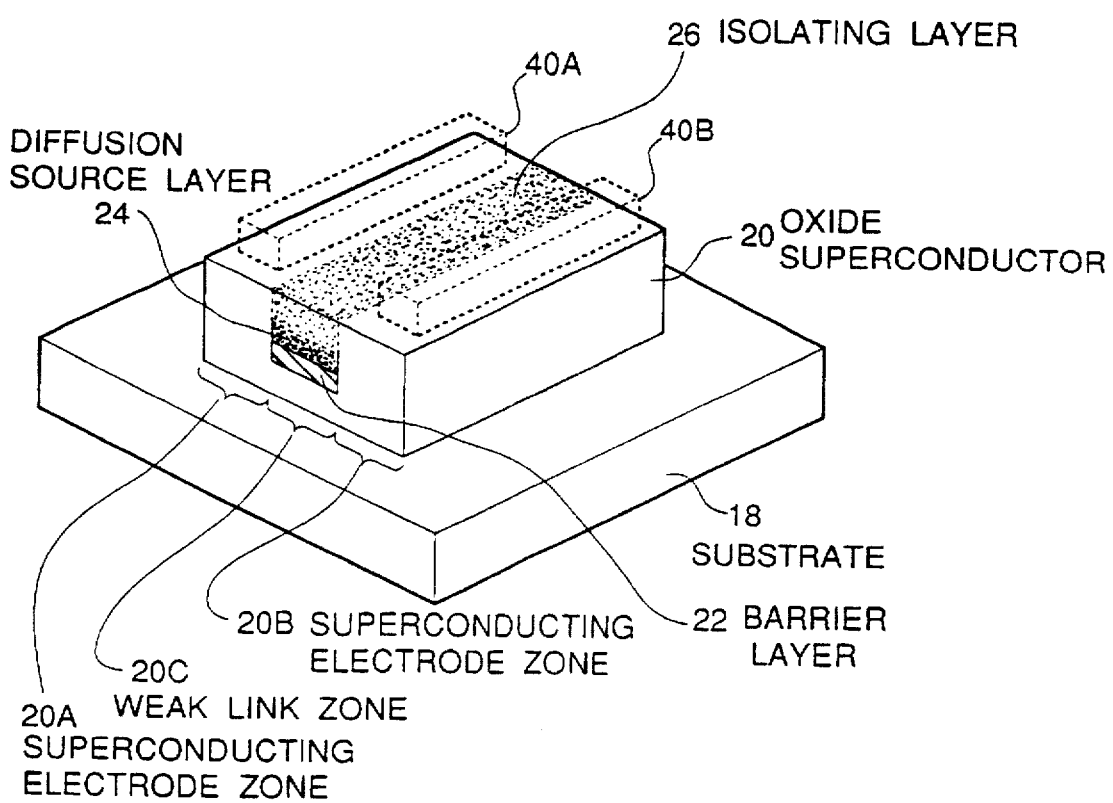
FIG. 3 is a diagrammatic perspective view of another embodiment of the superconducting device in accordance with the present invention.

Referring to FIG. 3, there is shown a diagrammatic perspective view of another embodiment of the superconducting device in accordance with the present invention. This second embodiment is a Josephson device.

The Josephson device includes a substrate 18, a pair of superconducting electrode zones 20A and 20B formed on the substrate 18 separately from each other, and a weak link zone 20C formed on the substrate between a pair of superconducting electrode zones 20A and 20B so as to couple the pair of superconducting electrode zones 20A and 20B.

Here, the shown device is formed of an oxide superconductor thin film 20, other then the substrate 18, and a barrier layer 22 and a diffusion material source layer 24 provided within the weak link zone 20C. The barrier layer 22 is formed separately from the substrate 18, and a diffusion material source layer 24 is formed directly on the barrier layer 22. The barrier layer 22 and the diffusion material source layer 24 are completely embedded in the oxide superconductor thin film 20. A diffusion material is diffused from the diffusion material source layer 24 into a portion 26 of the oxide superconductor thin film 20 above the diffusion material source layer 24, so that the portion 26 loses superconductivity. Namely, the portion 26 is an isolation region. As a result, in the weak link zone 20C, only a portion of the oxide superconductor thin film 20 under the barrier layer 22 has superconductivity. In addition, a pair of normal conductor electrodes 40A and 40B can be formed on the oxide superconductor thin film 20 in the superconducting electrode zones 20A and 20B, respectively.

Now, the process for manufacturing the above mentioned superconducting device will be described with reference to FIGS. 4A to 4F. In the embodiment which will be described below, a Y—Ba—Cu—O type compound oxide superconductor material is used for forming the oxide superconductor thin film.

Figure 4A:
FIGS. 4A to 4F are diagrammatic sectional views for illustrating the process for manufacturing the superconducting device shown in FIG. 3.

First, the substrate 18 having a flat upper or principal surface is prepared as shown in FIG. 4A. This substrate 18 is formed of an insulating substrate such as a MgO (100) substrate, a CdNdAlO$_4$ (001) substrate or others. If these substrates are used, a c-axis orientated oxide superconductor thin film having a large critical current density in a direction in parallel to the substrate surface can be formed on the substrate.

Figure 4B:
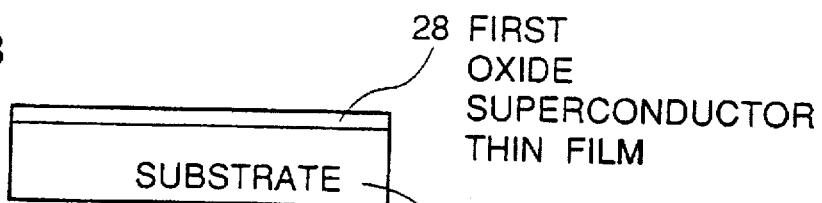

As shown in FIG. 4B, a first oxide superconductor thin film 28 is deposited on the substrate 10. This first oxide superconductor thin film 28 has an extremely thin thickness which is the same as that of a weak link region of a final or completed Josephson device so that the final or completed Josephson device has a desired characteristics. For example, the thickness of the first oxide superconductor thin film 28 is not greater than 10 nm. The first oxide superconductor thin film 28 can be deposited, by for example an off-axis sputtering, a reactive evaporation, a CVD, etc. In this example, the off-axis sputtering is performed under the condition that a sputtering gas is composed of Ar and O$_2$ at the rate of Ar:O$_2$=9:1, the sputtering gas pressure is 10 Pa, and the temperature is 700° C.

Figure 4C:
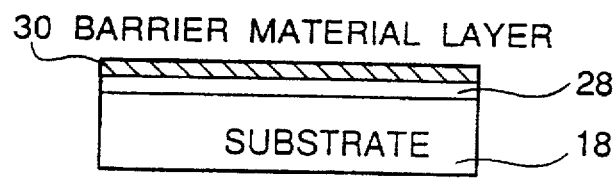

Then, as shown in FIG. 4C, a barrier material layer 30 is deposited on the first oxide superconductor thin film 28. This barrier material layer 30 is formed of a metal such as Au and Pt which are stable to the oxide superconductor material. In the case of Pt being used, the barrier material layer 30 is preferably deposited by an electron beam evaporation. In the case of Au being used, the barrier material layer 30 is preferably deposited by a vacuum evaporation. In this example, an Au thin film having a thickness not less than 25 nm is formed.

Figure 4D:
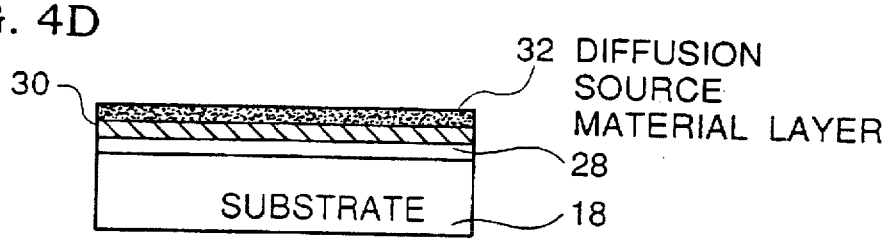

Furthermore, as shown in FIG. 4D, a diffusion material layer 32 is deposited on the barrier material layer 30. This diffusion material layer 32 is preferably composed of a silicon or silicide thin film having a thickness not less than 25 nm, which can be deposited by an evaporation process or a CVD process.

Figure 4E:
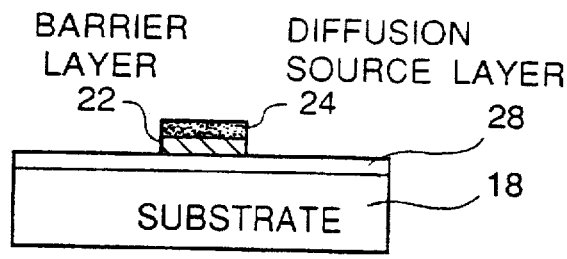

Thereafter, the diffusion material layer 32 and the barrier material layer 30 are patterned as shown in FIG. 4E, so that the diffusion material layer 32 and the barrier material layer 30 are left in only a zone corresponding to a weak link region of the final or completed Josephson device, and the first oxide superconductor thin film 28 is exposed in the other zone. In the shown example, the width of the weak link region (the length of the weak link region in a direction of a superconduction current flowing through the weak link region) is 0.25 μm. This patterning is performed by a reactive ion etching using a resist for electron beam. In this connection, the etching condition is controlled or adjusted so that a side etching of the diffusion material layer 32 and the barrier material layer 30 are sufficiently promoted. With this etching, the width of the weak link region can be made narrower than that of a resist pattern.

Thereafter, a second oxide superconductor thin film 20 is deposited on the substrate 10 on which the above mentioned various layers have been formed. The second oxide superconductor thin film 20 is deposited by a conventional sputtering under the condition that a sputtering gas is composed of Ar and $O_2$ at the rate of Ar: $O_2$=9:1, the sputtering gas pressure is 10 Pa, and the temperature is 700° C.

In this process, in the superconducting electrode zones 20A and 20B in which the first oxide superconductor thin film 28, the second oxide superconductor thin film 20 is epitaxially continuous to the first oxide superconductor thin film 28. Therefore, an integral oxide superconductor thin film is formed. Incidentally, for the purpose of elevating continuity between the first oxide superconductor thin film 28 and the second oxide superconductor thin film 20, it is preferred that a deposition surface is cleaned by a reverse sputtering before deposition of the second oxide superconductor thin film 20.

In the process of the deposition of the second oxide superconductor thin film 20, on the other hand, the diffusion material contained in the diffusion material layer 24 or the material itself of the diffusion material layer 24 is diffused into the second oxide superconductor thin film 20 deposited on the diffusion material layer 24. In other words, crystalline growth of the oxide superconductor thin film 20 is impeded or prevented. As a result, the isolation region 26 losing the superconductivity is formed on the diffusion material layer 24, and therefore, the superconducting electrode zones 20A and 20B are confined separately from each other.

The Josephson device thus formed has a substantially planar surface, but can be additionally planarized if necessary. In the Josephson device formed as mentioned above, since the weak link is formed directly on the substrate, even if a planarization processing is executed, the characteristics of the Josephson device is subjected to no adverse effect.

Figure 4F:
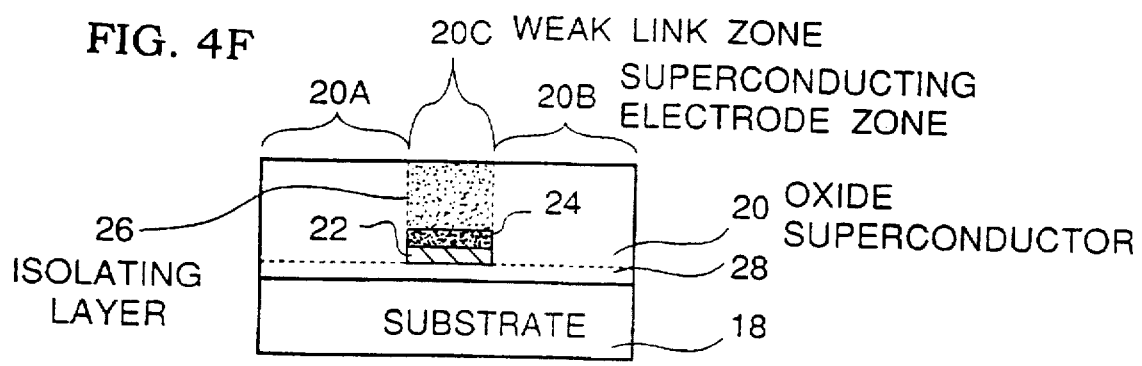

Here, it should be noted that, in view of the function of the super-FET, the silicon diffused region 51 is exaggeratingly depicted to extend not only on the upper surface of the polysilicon layer 17 but also on both side surfaces of the polysilicon layer 17, in the step shown in FIG. 2G, and on the other hand, in view of the function of the VTB type Josephson device, the isolation layer 26 is exaggeratingly depicted to extend only on the upper surface of the diffusion source layer 24 in FIG. 4F. In both of the process shown in FIG. 2A to 2I and the process shown in FIG. 4A to 4F, diffusion occurs in a lateral or sideward direction from the polysilicon layer 17 and the diffusion source layer 24. However, in the VTB type Josephson device, since the diffusion source layer 24 does not function as the conductor, it is sufficient if the portion above the diffusion source layer 24 is non-conductive so that a pair of superconducting electrode zones 20A and 20B can be coupled only through the weak link zone 20C. In addition, since the VTB type Josephson device can operate when the barrier layer 22 and hence the weak link zone 20C are less theft 1 μm. If the side diffusion is compared with the barrier layer 22 of about 0.25 μm in the shown embodiment, the amount or size of the side diffusion would be negligible. On the other hand, in the super-FET, since the gate electrode has to be completely isolated, the upper surface and both side surfaces of the polysilicon layer 17 have to be covered by the silicon diffused region 51 having a sufficient thickness to completely isolate the gate electrode. In addition, the super-FET can operate when the gate length is less than 0.1 μm. If the side diffusion is compared with the gate length of less than 0.1 μm, the amount or size of the side diffusion would never be negligible.

The invention has thus been shown and described with reference to the specific embodiments. However, it should be noted that the present invention is in no way limited to the details of the illustrated structures but changes and modifications may be made within the scope of the appended claims.

We claim:

1. A method of manufacturing a superconducting device, comprising the steps of preparing a substrate having a planar principal surface thereof, forming a first oxide superconductor thin film having an extremely thin thickness which is capable of constituting a superconducting channel on the principal surface of the substrate, forming on a portion of the first oxide superconductor thin film a stacked structure including a barrier layer formed directly on the first oxide superconductor thin film and a diffusion source layer formed on the barrier layer, and growing a second oxide superconductor thin film on an exposed surface of the first oxide superconductor thin film until the stacked structure is embedded in the second oxide superconductor film, whereby at least one material contained in the diffusion source layer is diffused into a region of the second oxide superconductor thin film surrounding the diffusion source layer, and the diffused region does not show superconductivity when a non-diffused region of the second oxide superconductor thin film shows superconductivity.

2. A method claimed in claim 1, wherein after formation of the second oxide superconductor thin film, a resist layer is coated on the second oxide superconductor thin film so as to have a flat upper surface, and the resist layer and the second oxide superconductor thin film are etched back until the second oxide superconductor thin film has the planar upper surface.

3. A method claimed in claim 2, wherein the second oxide superconductor thin film is etched back until the diffusion source layer is exposed.

* * * * *